United States Patent [19]

Lurey et al.

[11] Patent Number: 5,754,597
[45] Date of Patent: May 19, 1998

[54] METHOD AND APPARATUS FOR ROUTING A DIGITIZED RF SIGNAL TO A PLURALITY OF PATHS

[75] Inventors: Daniel M. Lurey, Hoffman Estates, Ill.; Yuda Y. Luz, Euless, Tex.; Sheila M. Rader, Wildwood; Alan P. Rottinghaus, Barrington, both of Ill.

[73] Assignee: Motorola, Inc., Schaumburg, Ill.

[21] Appl. No.: 619,229

[22] Filed: Mar. 21, 1996

Related U.S. Application Data

[63] Continuation-in-part of Ser. No. 366,283, Dec. 29, 1994, Pat. No. 5,579,341.

[51] Int. Cl.$^6$ ................................................. H04L 27/04
[52] U.S. Cl. .......................... 375/295; 375/296; 370/357
[58] Field of Search .................................. 375/295, 296, 375/299, 308; 370/351, 357, 367; 340/825.03, 826

[56] References Cited

U.S. PATENT DOCUMENTS

| 3,783,385 | 1/1974 | Dunn et al. | 375/329 |
|---|---|---|---|
| 3,991,277 | 11/1976 | Hirata | 370/484 |
| 4,101,738 | 7/1978 | Bellanger et al. | 370/484 |

(List continued on next page.)

FOREIGN PATENT DOCUMENTS

| 470 038 | 10/1993 | Sweden. |
|---|---|---|
| 95/12261 | 5/1995 | WIPO. |

OTHER PUBLICATIONS

Harris Semiconductor Digital Signal Processing Databook, "Numerically Controlled Oscillator/Modulator", HSP45116, pp. 5–26/5–40, Harris Corporation.

Fundamentals of Digital Image Processing by Anil K.Jain, University of California, Davis, 1989 by Prentice–Hall, Inc., pp. 155–159, 185–187.

"Robust Digital Filter Structures", 7-3 Cascade Form Digital Filter Structures, Handbook for Digital Signal Processing by Sanjit Mitra and James Kaiser, John Wiley & Sons 1993.

Hogenauer, Eugene B. "An Economical Class of Digital Filters for Decimation and Interpolation", IEEE Transactions on Acoustics, Speech and Signal Processing, vol. ASSP-29, No. 2.

ETSI-SMG, GSM 06.31, 4.0.0, Discontinuous Transmission (DTX) for Full Rate Speech Transmission Channels, Oct. 1992.

ETSI-SMG, GSM 06.12, 4.0.1, Comfort Noise Aspects for Full Rate Speech Traffic Channels, Jan. 1993.

EIA/TIA/IS-95, Requireemnts for Base Station CDMA Operation, pp. 7-1/7-185, Appendix A Requiremetns for CDMA Service OptionsA-1/A-68.

Jain, Anil K., "Fundamentals of Digital Image Processing", Printice-Hall, Inc., 1989, pp. 155-159, 185-187.

Bellanger, et al., "TDM-FDM Transmultiplexer: Digital Polyphase and FFT", IEEE Transactions on Communications, vol. Comm-22, No. 9, Sep., 1974, pp. 1199-1206.

Crochiere, et al., "Multirate Digital Signal Processing", Chapter 2: pp. 20–21, 32 and 48–56; Chapter 3: pp. 59–126; and Chapter 7: pp. 289-404.

Primary Examiner—Young T. Tse
Attorney, Agent, or Firm—Donna Rogers Maddox

[57] ABSTRACT

Generally stated, an apparatus and method for routing a digitized radio frequency (RF) signal 140–143 to a plurality of paths is described herein. In accordance with a first preferred embodiment, the apparatus comprises a digital upconverter/modulator (DUC) 125, 129 coupled to a scaling and switching network 100N which is comprised of, at minimum, a first, second, third and fourth digital switch, and a first, second and third adder. Within the scaling and switching network 100N, the first digital switch is responsive to the DUC 125,129. The first adder is responsive to the first and second digital switches, while the second adder is responsive to the third and fourth digital switches. Finally, the third adder is responsive to the first and second adders.

20 Claims, 7 Drawing Sheets

U.S. PATENT DOCUMENTS

| | | | |
|---|---|---|---|
| 4,112,374 | 9/1978 | Steinbrecher | 455/6.2 |
| 4,206,320 | 6/1980 | Keasler et al. | 370/204 |
| 4,230,956 | 10/1980 | Steinbrecher | 327/122 |
| 4,237,551 | 12/1980 | Narasimha | 370/307 |
| 4,316,282 | 2/1982 | Macina | 370/484 |
| 4,355,405 | 10/1982 | Ruys et al. | 375/275 |
| 4,492,962 | 1/1985 | Hansen | 342/369 |
| 4,514,760 | 4/1985 | Balaban et al. | 348/484 |
| 4,517,586 | 5/1985 | Balaban et al. | 348/572 |
| 4,616,364 | 10/1986 | Lee | 375/202 |
| 4,621,337 | 11/1986 | Cates et al. | 364/727 |
| 4,652,858 | 3/1987 | Kokubo et al. | 341/144 |
| 4,785,447 | 11/1988 | Ichiyoshi | 370/210 |
| 4,803,727 | 2/1989 | Holt et al. | 381/1 |
| 4,876,542 | 10/1989 | van Bavel et al. | |
| 4,881,191 | 11/1989 | Morton | 364/724.13 |
| 4,881,222 | 11/1989 | Goeckler et al. | 370/484 |
| 4,884,265 | 11/1989 | Schroeder et al. | 370/484 |
| 4,893,316 | 1/1990 | Janc et al. | 375/271 |
| 5,001,742 | 3/1991 | Wang | 379/60 |
| 5,046,066 | 9/1991 | Messenger | 370/349 |
| 5,101,501 | 3/1992 | Gilhousen et al. | 455/33.2 |
| 5,103,459 | 4/1992 | Gihousen et al. | 370/209 |
| 5,109,390 | 4/1992 | Gilhousen et al. | 370/335 |
| 5,136,612 | 8/1992 | Bi | 370/342 |
| 5,159,608 | 10/1992 | Falconer et al. | 375/200 |
| 5,170,413 | 12/1992 | Hess et al. | 375/260 |
| 5,187,809 | 2/1993 | Rich et al. | 455/33.1 |
| 5,220,557 | 6/1993 | Kelley | 370/345 |
| 5,220,583 | 6/1993 | Solomon | 375/328 |
| 5,224,122 | 6/1993 | Bruckert | 375/200 |
| 5,278,837 | 1/1994 | Kelley | 370/343 |
| 5,289,464 | 2/1994 | Wang | 370/330 |
| 5,293,329 | 3/1994 | Wishart et al. | 364/724.13 |
| 5,295,153 | 3/1994 | Gudmundson | 370/335 |
| 5,299,192 | 3/1994 | Guo et al. | 370/210 |
| 5,305,349 | 4/1994 | Dent | 370/209 |
| 5,313,279 | 5/1994 | Wang et al. | 348/426 |
| 5,323,157 | 6/1994 | Ledzius et al. | 341/143 |
| 5,323,391 | 6/1994 | Harrison | 370/210 |
| 5,347,284 | 9/1994 | Volpi et al. | 342/356 |
| 5,396,489 | 3/1995 | Harrison | 370/210 |
| 5,403,933 | 4/1995 | Boutaud et al. | 364/724.1 |
| 5,406,629 | 4/1995 | Harrison et al. | 380/34 |
| 5,440,311 | 8/1995 | Gallagher et al. | 342/132 |

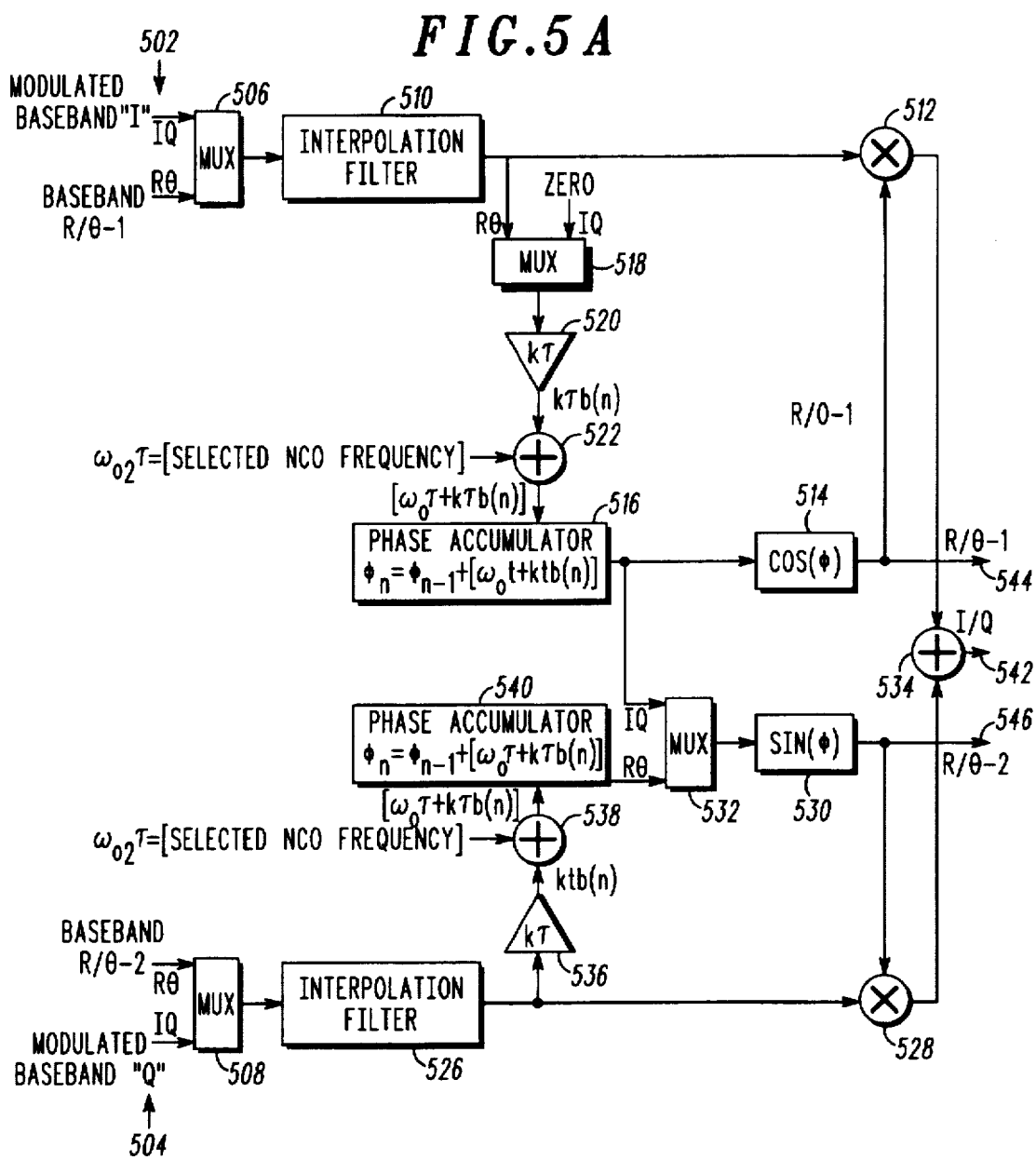

METHOD AND APPARATUS FOR ROUTING A DIGITIZED RF SIGNAL TO A PLURALITY OF PATHS

This application is a continuation-in-part of U.S. patent application Ser. No. 08/366,283 filed Dec. 29, 1994, now U.S. Pat. No. 5,579,341.

FIELD OF THE INVENTION

The present invention relates generally to communication systems, and more particularly, to a method and apparatus for routing a digitized radio frequency (RF) signal to a plurality of paths in a wireless communication system.

BACKGROUND OF THE INVENTION

Wireless communication systems are well known and consist of many types including land mobile radio, cellular radiotelephone (inclusive of analog cellular, digital cellular, personal communication systems (PCS) and wideband digital cellular systems), and other communication system types. In cellular radiotelephone communication systems, for example, a number of communication cells, serviced by base transceiver stations (BTS), are typically linked to a base station controller (BSC) forming a base station system (BSS). The BSCs are, in turn, linked to a mobile switching center (MSC) which provides a connection between the BSS and a public switched telephone network (PSTN), as well as interconnection to other BSS. Mobile communication units (or mobile stations) (MS), operating within the communication cells, transmit signals to (uplink) and receive signals from (downlink) the serving BSS. The signals are processed by the BTS, BSC and MSC to complete a communication transaction with another MS, or through the PSTN to a land-line telephone user.

Within a BTS there may be a plurality of communication channels to be directed to any number of signal paths. Alternatively, a single communication channel may be routed to a plurality of signal paths. In a conventional omni system, there is a single omni directional transmission antenna to which signals from each of the communication channels in the BTS are combined, in a known fashion, and directed to the antenna. In multiple antenna systems, signals from each of the communication channels may be sent to one or more of the antennas. A conventional apparatus to perform such routing uses analog devices, such as RF combiners, switches and splitters to route signals to a desired antenna for transmission. A drawback to this conventional apparatus, however, is that such analog devices are generally "lossy". That is, that the signal power level will be reduced as it is routed through the analog devices, which results in a degraded signal and poor signal quality of the transmitted signals.

Thus, there exists a need for an improved method or apparatus to combine and route RF signals to be transmitted by a wireless communication system.

SUMMARY OF THE INVENTION

In order to address this need, an apparatus and method for routing a digitized radio frequency (RF) signal to a plurality of paths is described herein. In accordance with a first preferred embodiment, the apparatus comprises a numerically controlled oscillation and modulation device (NCOM), a first, second, third and fourth digital switch, and a first, second and third adder. The first digital switch is responsive to the NCOM. The first adder is responsive to the first and second digital switches, while the second adder is responsive to the third and fourth digital switches. The third adder is responsive to the first and second adders.

In accordance with another preferred embodiment, the apparatus comprises a quadrature frequency upconverter/modulator (QFUM), a first, second, third and fourth digital switch, and a first, second and third adder. The first digital switch is responsive to the QFUM. The first adder is responsive to the first and second digital switches, while the second adder is responsive to the third and fourth digital switches. The third adder is responsive to the first and second adders.

In accordance with another preferred embodiment, the apparatus comprises a multi-function upconverter/modulator, a first, second, third and fourth digital switch, and a first, second and third adder. The first digital switch is responsive to the multi-function upconverter/modulator. The first adder is responsive to the first and second digital switches, while the second adder is responsive to the third and fourth digital switches. The third adder is responsive to the first and second adders.

In yet a fourth preferred embodiment, a method of routing a digitized RF signal to a plurality of paths is provided. The method comprises the steps of generating a plurality of digital signals, routing the digital signal to a plurality of summers, summing a plurality of digital signals producing a summed signal, scaling the summed signal producing a summed and scaled signal and routing the summed and scaled signal to a plurality of transmission antennas. During operation, a plurality of digital signals are generated.

A detailed explanation of the preferred embodiments is best described with reference to the following figures.

BRIEF DESCRIPTION OF THE DRAWINGS

FIG. 5a is a block diagram representation of another preferred embodiment of a multi-function upconverter/modulator for use as the digital upconverter/modulator (DUC) of FIG. 1;

DETAILED DESCRIPTION OF THE PREFERRED EMBODIMENT

Figure 1:
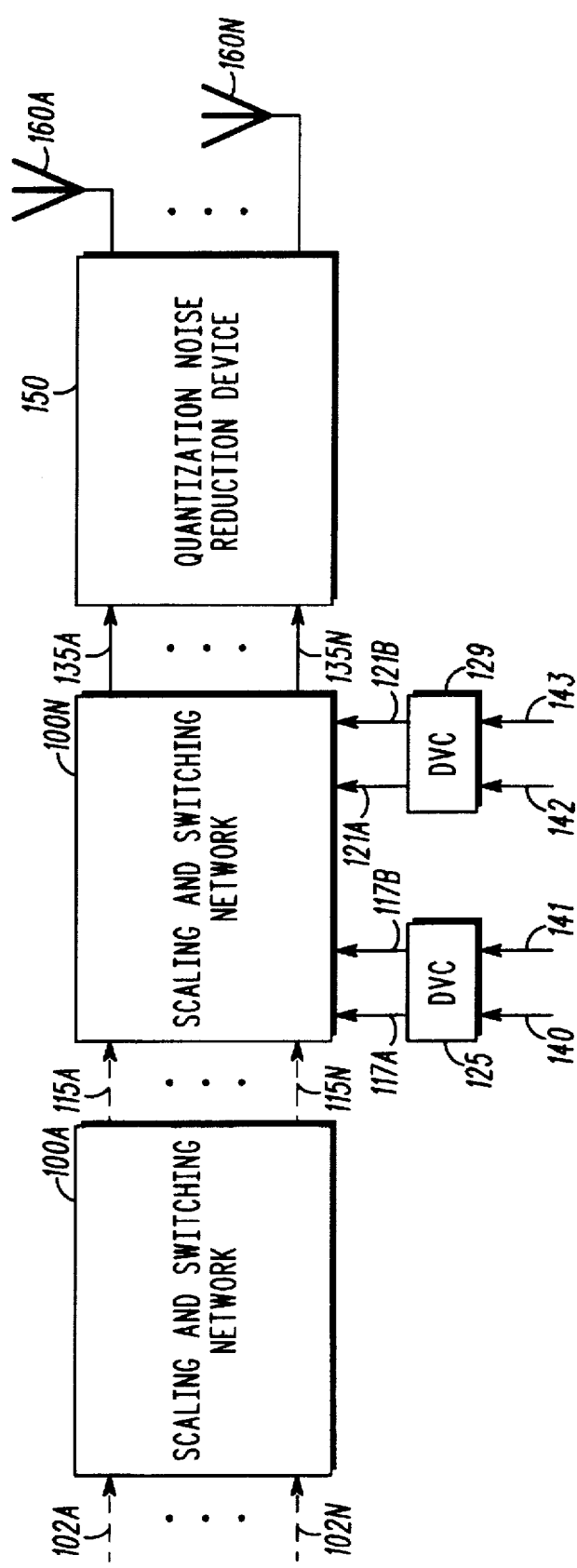
FIG. 1 is a block diagram that generally depicts a preferred embodiment of an apparatus for routing a digitized radio frequency (RF) signal to a plurality of paths.
Figure 2:
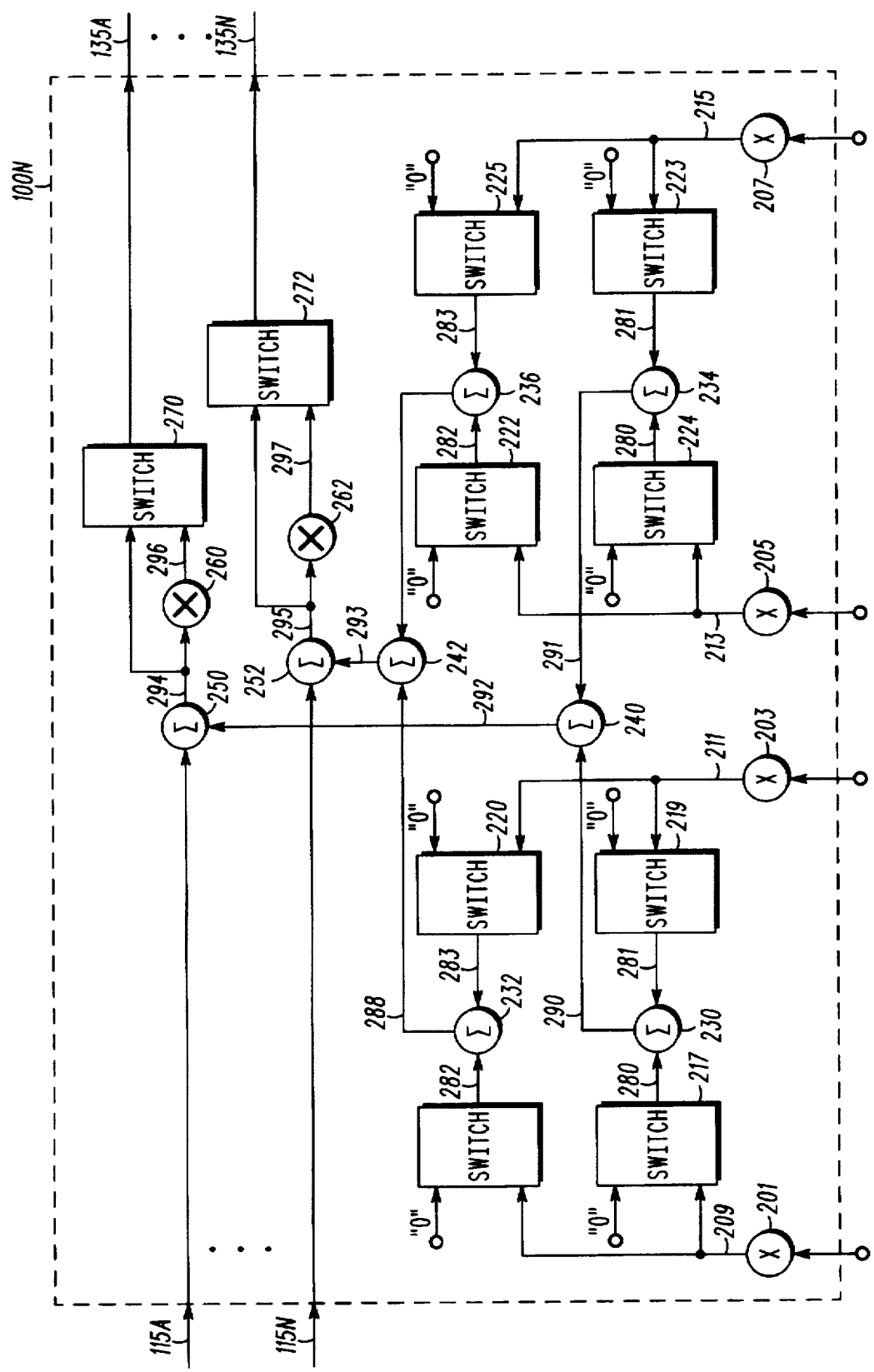
FIG. 2 is a more detailed block diagram of the scaling and switching network of FIG. 1.

Generally referring to FIGS. 1 and 2, an apparatus generates a plurality of baseband signals 140–143. The baseband signals 140-143 are processed 125, 129 into a digital representation 117a, 117b, 121a, 121b, respectively, and coupled to a scaling and switching network 100N. Depending on the preferred embodiment (described infra with reference to FIGS. 3, 4, 5a and 5b), the digitized baseband signals 117, 121 may consist of modulated intermediate frequency (IF) signals such as the real portion of the modulated IF carrier, or the I and Q portions of the modulated IF carrier. Within the scaling and switching network 100N, the digitized baseband signal 117, 121 may be scaled on a per channel basis 201-207, summed 250, 252 with signals 115A-115N from previous scaling and switching networks 100A, and scaled again on a per sector basis 260, 262 prior to being routed 135A-135N to any of a plurality of transmission antennas 160A-160N without the power degradation commonly associated with prior art analog-based systems.

FIG. 1 is a block diagram depicting an apparatus for routing a digitized radio frequency (RF) signal to a plurality of paths consistent with the preferred embodiment. As shown, the apparatus is comprised of a plurality of scaling and switching network elements 100A-100N, which may be cascaded with an interconnection bus 102A-102N, 115A-115N. The output 135A-135N of the final stage of the cascaded scaling and switching network 100N is preferably coupled to a digital quantization noise reduction device 150, or any other suitable quantizer (not shown) used as an interface to a digital-to-analog converter (DAC) (not shown), and then to transmission antennas 160A-160N. The scaling and switching network elements 100A-100N have a plurality of inputs which may be grouped into two categories. The first category consists of the output of a prior scaling and switching network element as represented by 102A-102N, 115A-115N in FIG. 1. The second category of input consists of a plurality of input baseband signals 140-143 (using 100N as a representative example). These baseband signals 140-143 are coupled to a digital upconverter/modulator (DUC) 125, 129 the output of which 117, 121 is subsequently coupled to the scaling and switching network 100N. It should be noted that FIG. 1 merely represents two (2) DUC's (125, 129) for brevity and clarity purposes, however, any number of DUC's may be applied to the scaling and switching network 100N by merely expanding the number of branches thereof.

During operation, baseband signals 140-143 are processed by the DUC 125, 129 before being coupled to the scaling and switching network 100N. The scaling and switching network 100N, depending on the desired transmission point and power level, may scale the signals on a per channel or per sector basis and, preferably, route the signals 135A-135N to a digital quantization noise reduction device 150. The digital quantization noise reduction device 150 groups the input signals 135A-135N into "words", preferably of 8-64 bits, prior to transmission by any or all of the plurality of transmission antennas 160A-160N. A detailed description of the scaling and switching network 100N is provided in FIG. 2, while a detailed description of the digital quantization noise reduction device 150 is provided as FIG. 6.

Turning to the operation of the scaling and switching network 100A-100N, and referring to FIG. 2, a detailed block diagram of the scaling and switching network 100N is illustrated. Specifically, the scaling and switching network 100N is comprised of a plurality of digital switches 217-220, 222-225, 270, 272. Switches 217-220, 222-225, 270,272 will hereafter be referred to as first stage digital switches 217-220, 222-225, and second stage digital switches 270,272. In addition to the switches 217-220, 222-225, 270,272, the scaling and switching network 100N is comprised of a plurality of adders 230, 232, 234, 236, which are likewise grouped into categories of first stage adders 230, 232, 234, 236, second stage adders 240, 242 and third stage adders 250,252. Outputs 280-287 of the first stage digital switches 217-220, 222-225 are operatively coupled to inputs of first stage adders 230, 232, 234, 236. The first stage full adders 230, 232, 234, 236 are operatively coupled to the second stage full adders 240, 242 which are operatively connected to the third stage full adders 250, 252. In addition, the third stage adders 250, 252 may be operatively responsive to previous scaling and switching network elements 100A-100(N-1) via the plurality of bus lines 115A-115N. Outputs 294, 295 of the third stage adders 250, 252 are passed to inputs of second stage digital switches 270, 272. In addition, output 294, 295 of the third stage adders 250, 252 are scaled by multipliers 260, 262 and coupled to an input of the second stage digital switches 270, 272. The second stage digital switches 270, 272 may then select the un-scaled inputs 294, 295 directly from the third stage adders 250, 252 or the scaled outputs 296, 297 from the multipliers 260, 262. Outputs 135A-135N of the second stage digital switches 270, 272 are preferably coupled to the digital quantization noise reduction device 150, but may be directly coupled to any number of the plurality of transmission antennas 160A-160N.

During operation, the scaling and switching network 100A-100N functions as follows. Digitized baseband signals 117a-117b, 121a-121b (again, the number of signals routed on bus lines 117, 121 is dependent upon the particular embodiment) are coupled to the input of the scaling and switching network 100N. The signals 117, 121 may then be scaled, on a per-channel basis, by multipliers 201, 203, 205, 207 resulting in scaled signals 209, 211, 213, 215 which are operatively coupled to the plurality of first stage digital switches 217-220, 222-225. Depending on which of the antennas the individual baseband signals 209-215 will be transmitted over, the first stage digital switches 217-220, 222-225 may either pass the scaled input signals 209, 211, 213, 215 to the first stage adders 230, 232, 234, 236, or may pass a null string of "0's".

The first stage adders 230, 232, 234, 236 sum the outputs 280-287 of the first stage digital switches 217-220, 222-225, and produces summed outputs 288-291 which are coupled to second stage adders 240, 242. The outputs 292, 293 of the second stage adders 240, 242 are subsequently coupled to the third stage adders 250, 252 where the scaled and summed baseband signals 292, 293 are added to the outputs 115A-115N of the prior scaling and switching network 100A. The summed output 294, 295 of all prior scaling and switching networks 100A-100(N-1) (not shown), as well as the scaled and summed baseband signals 292, 293 of the current scaling and switching network 100N is coupled to an input of the second stage digital switch 270, 272. In addition, the summed outputs 294, 295 of the third stage adders 250, 252 are coupled to the multiplier 260, 262 which will scale the output signals 294, 295 yielding scaled output signals 296-297 which are coupled to a distinct and separate input of the second stage digital switches 270, 272, respectively. The selected output 135A-135N of the second stage digital switches 270, 272 may then be passed to a subsequent scaling and switching network 100(N+1) (not shown), and ultimately, in the preferred embodiment, to the digital quantization noise reduction device (150), or to transmission antennas (160A-160N) for transmission to the appropriate MS (not shown).

An advantage of the scaling and switching network 100N, as depicted in FIG. 2, is that the digitized baseband signals 117a–117b, 121a–121b may be scaled on a channel by channel basis via the multiplier elements 201–207, as well as on a sector by sector basis via multiplier elements 260, 262. Additionally, as the signals 117a–117b, 121a–121b are processed in the digital domain, the resulting signal suffers only nominal loss of information due to rounding errors as opposed to signal manipulation in the analog domain, which typically results in a significant degradation of the signal strength and reduced signal quality. The use of this device is particularly beneficial in Sig-on-Sector applications as well as Dynamic Equipment Sharing (DES) applications as it reduces the degradation in signal quality commonly associated with prior art analog devices.

Sig-on-Sector is a term of art used in the wireless communications industry to describe an application where it is desired that a base station simulcast its signaling channel in a plurality of sectors. In order to accomplish this using prior art analog devices, the signal to be transmitted is typically routed through a number of switches and combiners, all of which weaken the signal as it is processed by these "lossy" devices. Similarly, Dynamic Equipment Sharing (DES) is a situation where a BSS is comprised of multiple BTS's all routed to/from a common front-end. That is, the output signals from a plurality of BTS's are all combined and switched to common transmission antenna's. In this application, as in the Sig-on-Sector application, a plurality of signals are required to be combined and routed to a plurality of paths. The prior art analog systems are inefficient resulting in reduced signal strength, whereas the preferred embodiments of the pending application reduces the impact to the signal to be transmitted.

Figure 3:
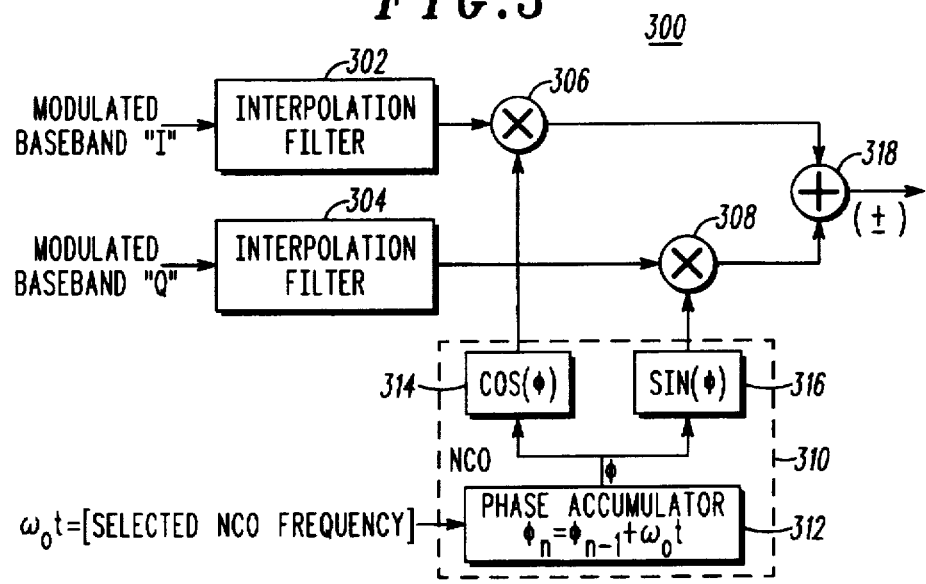
FIG. 3 is a block diagram representation of a preferred embodiment of a quadrature frequency upconverter/modulator adaptable for use as the digital upconverter/modulator (DUC) of FIG. 1.

With reference to FIG. 3, a preferred embodiment of quadrature frequency upconverter/modulator (QFUM) 300, adaptable for use as the digital upconverter/modulator (DUC) 125, 129 of FIG. 1 is shown. The QFUM 300 includes first and second interpolation filters 302 and 304 (e.g. finite impulse response (FIR) filters) for interpolating the modulated I,Q portions of the input baseband signals, 140, 141 or 142, 143 respectively. The interpolated I,Q portions of the baseband signal are received in mixers 306 and 308, as well as input from numerically controlled oscillator 310. Numerically controlled oscillator (NCO) 310 receives as an input the product of the frequency, $\omega_o$, and the inverse sample rate, $\tau$, which is a fixed phase increment dependent on the frequency, $\omega_o$. This product is supplied to a phase accumulator 312 within NCO 310. The output of phase accumulator 312 is a sample phase, $\Phi$, which is communicated to sine and cosine generators 314 and 316, respectively, for generating the sinusoid. The I,Q portions of the modulated IF carrier are then processed by a dual mode summing node 318. Depending upon the preferred embodiment, the dual mode summing node 318 will either sum the signals (as depicted with the "+" sign), thereby providing as output a QPSK modulated IF signal (117, 121) or, alternatively, the dual mode summing node 318 will subtract the signals (as depicted by the "−" sign), thereby providing as output a quadrature upcoverted IF signal (117, 121). As is evident from this discussion, given two baseband inputs 140–141, 142–143 result in a single quadrature upconverted or QPSK modulated IF signal output 117a and 121a respectively. Thus, when using the QFUM 300 as the DUC 125,129 of FIG. 1, two such devices may be coupled to the scaling and switching network 100N, with the unused scaling and switching network 100N inputs 117b, 121b being zero.

Figure 4:
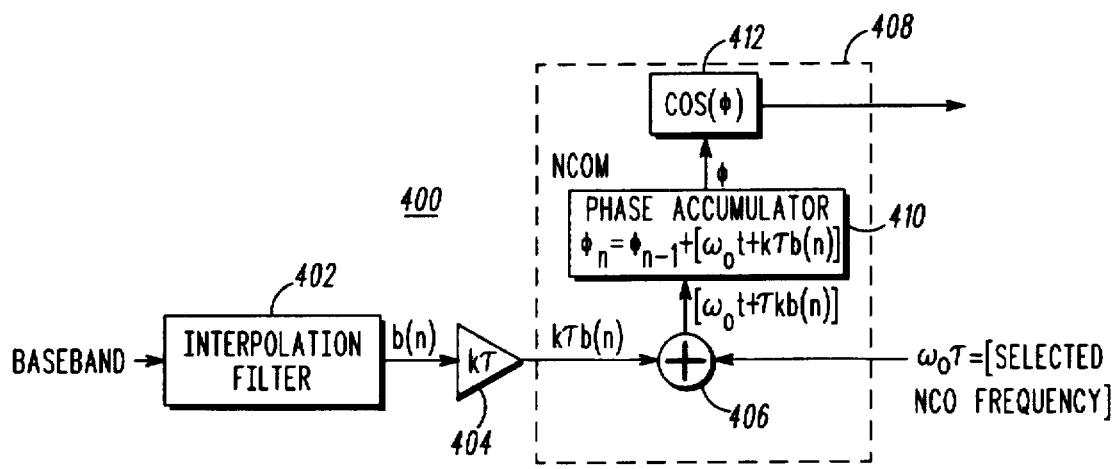
FIG. 4 is a block diagram representation of a modulator adaptable for use as the digital upconverter/modulator (DUC) of FIG. 1.

In FIG. 4, a modulator 400 for R,Θ modulation, direct modulation of the phase, is shown. Modulator 400 provides a simplified method of generating FM signals over that of the QFUM 300. A single baseband signal (140, 141, 142 or 143) is communicated to interpolation filter 402 (e.g. FIR filter) which is then scaled by $k\tau$ in scaler 404. The interpolated and scaled baseband signal is summed in summer 406 with the fixed phase increment $\omega_o\tau$ in a numerically controlled oscillator/modulator (NCOM) 408. This sum is then communicated to a phase accumulator 410 which outputs a sample phase, $\Phi$, which in turn is communicated to a sinusoid generator 412 for generating the modulated IF signal output (117a, 117b, 121a or 121b) of modulator 400. As is evident from the figure, a single input baseband signal 140, 141, 142, 143 results in a single modulated IF signal output 117a, 117b, 121a, 121b respectively. Thus, four such modulators 400 may be coupled to the scaling and switching network 100N, two each for DUC 125 and 129.

Figure 5B:
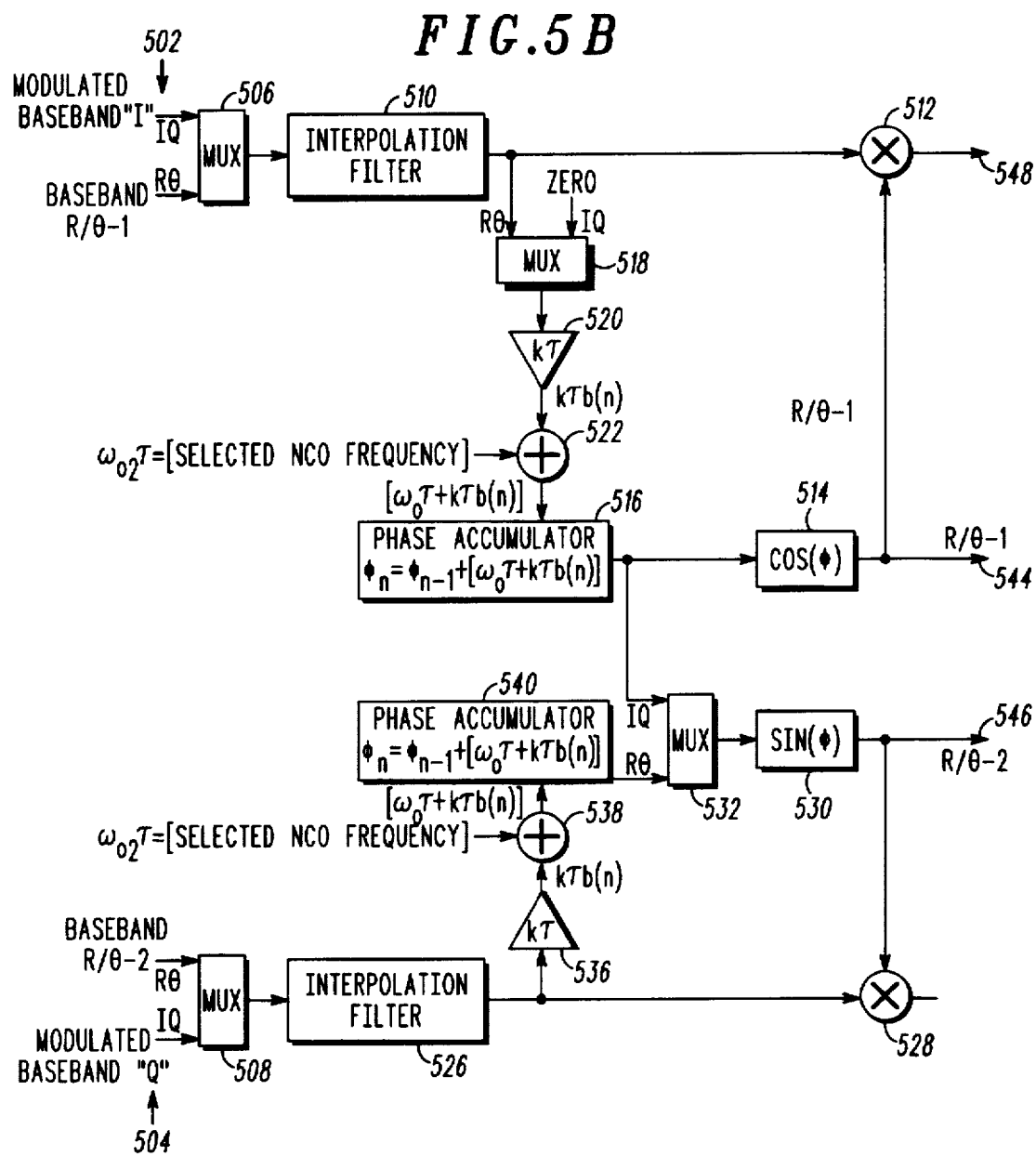
FIG. 5b is a block diagram representation of another preferred embodiment of the multi-function upconverter/modulator for use as the digital upconverter/modulator (DUC) of FIG. 1.

The devices shown in FIGS. 3 and 4 are suitable for use in digital upconverter/modulator (DUC) 125, 129 of the preferred embodiment of FIG. 1. However, in FIGS. 5a and 5b, a preferred multi-function upconverter/modulator 500a and 500b, respectively, which provide both I,Q upconversion and modulation, such as QPSK or FM modulation, is shown. For example, the multi-function upconverter/modulator 500a, 500b provides I,Q upconversion and modulation for an I,Q representation of a baseband signal, or R,Θ modulation for two baseband signals. The I,Q portions of the baseband signal or two R,Θ signals are input to multi-function upconverter/modulator 500a, 500b at ports 502 and 504. Signal selectors 506 and 508 are provided and select between the I,Q or R,Θ signals based upon the mode of operation of digital upconverter/modulator 500a, 500b. The difference between the two disclosed embodiments of the multi-function upconverter/modulator 500a and 500b is that in 500a the I and Q portions of the modulated IF signals are summed (e.g. added or subtracted) at dual-mode summing node 534, whereafter the combined I/Q portions of the modulated IF carrier signal 542 is applied to input 117a (by example only) of the scaling and switching network 100N, while the adjacent branch, in this example 117b, is held to zero. In FIG. 5b the multi-function upconverter/modulator 500b, will take the I and Q portions of the modulated IF signals at 502 and 504, respectively, and supply the signals 548, 549 to the input pair 117a, 117b (or 121a, 121b) of the scaling and switching network 100N.

With respect to processing of an I,Q signal, the I portion of the signal is communicated from selector 506 to interpolation filter, (e.g., an FIR filter) 510. The interpolated I signal is then communicated to mixer 512 where it is mixed with a sinusoid from cosine generator 514. Cosine generator 514 receives an input sample phase $\Phi$ from phase accumulator 516. A selector 518 is provided and selects a zero input for I,Q upconversion/modulation. The output of selector 518 is scaled by $k\tau$ in scaler 520 yielding a zero output which is added to $\omega_o\tau$ in adder 522. This sum, which is $\omega_o\tau$ in the I,Q upconversion/modulation case, is input to phase accumulator 516 to produce the sample phase output, $\Phi$.

Processing of the Q portion of the signal is similar. The Q signal is selected by selector 508 and communicated to interpolation filter (e.g., an FIR filter) 526. The interpolated Q signal is then communicated to mixer 528 where it is mixed with a sinusoid from sine generator 530. Sine generator 530 receives an input from selector 532 which selects the sample phase, $\Phi$, generated by phase accumulator 516 in the I,Q case.

In FIG. 5a, the I and Q portions of the modulated IF signal are then summed (e.g. added or subtracted) in dual-mode summing node 534 and output by digital upconverter/ modulator (DUC) (125, 129). In FIG. 5b, the I and Q portions of the modulated IF signal will not be summed, as in FIG. 5a, but rather fed to the scaling and switching network 100N inputs 117a and 117b or 121a and 121b, respectively.

In R,Θ processing FIGS. 5a and 5b the multi-function upconverter/modulators 500a and 500b are functionally equivalent, and will be referred to as 500. In R,Θ mode the selectors 506 and 508 select two separate R,Θ signals. For R,Θ processing, multi-function upconverter/modulator 500 is operable to process two R,Θ signals simultaneously. The first signal, R,Θ-1 is interpolated and filtered in interpolation filter 510. In the RΘ case, selector 518 selects the interpolated R,Θ-1 signal which is scaled by $k\tau$ in scaler 520 and added to $\omega_o\tau$ in adder 522. The output of adder 522 is then communicated to phase accumulator 516 which produces a sample phase, Φ which is input to cosine generator 514. The output of cosine generator 514 is one of two modulated IF signal outputs of the multi-function upconverter/modulator 500 in R,Θ processing mode.

The second R,Θ signal, R,Θ-2, is selected by selector 508 and is communicated to interpolation filter 526. The interpolated R,Θ-2 signal is then communicated to scaler 536 where it is scaled by $k\tau$. The scaled signal is then summed with $\omega_o\tau$ in adder 538. The output of adder 538 is input to phase accumulator 540 which produces an output sample phase, Φ which is selected by selector 532 and communicated to sine generator 530. The output of sine generator 530 is the second of two modulated IF signal outputs of the multi-function upconverter/modulator 500 in R,Θ processing mode. As depicted in FIGS. 5a and 5b, when operating as an FM modulator, both embodiments provide the modulated IF signals R/Θ-1 and R/Θ-2 544, 546 to scaling and switching network 100N inputs 117a and 117b or 121a and 121b. Finally, it is contemplated from FIGS. 5a and 5b, in light of the foregoing discussion, that there will be one (1) multi-function upconverter/modulator required for each of the DUC's depicted in FIG. 1 (e.g. one for DUC 125 and another for DUC 129).

Figure 6:
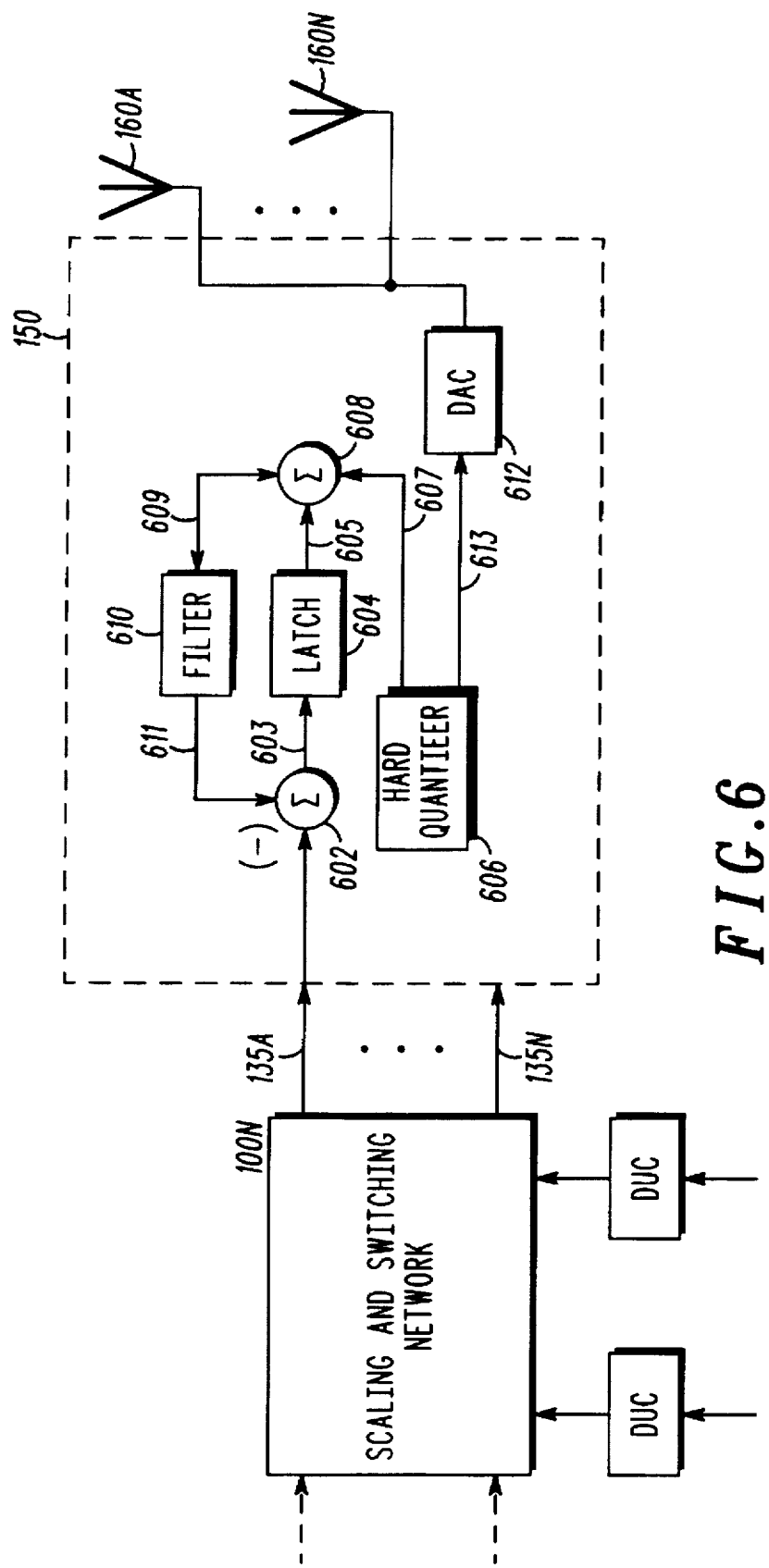
FIG. 6 is a block diagram representation of a digital quantization noise reduction device.

FIG. 6 generally depicts a digital quantization noise reduction device such as that which is described in the U.S. Pat. No. 5,602,874 CE02827R) by Luz et al, assigned to the assignee of the pending application, the disclosure of which is expressly incorporated herein by reference.

Specifically, FIG. 6 is a block diagram illustration of a digital quantization noise reduction device 150. The output signal 135 resulting from the scaling and switching network 100N is coupled to the N-bit to M-bit, where M<N, digital quantization noise reduction device 150. The N-bit signal 135, is coupled to a first summer 602 where a N-bit feedback signal 611 is subtracted. The resulting signal 603 is then sampled in a N-bit latch 604 and concomitantly quantized in a M-bit hard quantizer 606. Hard quantizer 606 truncates the N-M LSBs of signal 603, effectively setting the M-N LSBs to a value of zero. A N-bit error signal 609, is generated in summer 608 as the difference between the M most signification bits (MSBs) of the N-bit sample of 603 contained in latch 604 and the M-bit quantized sample contained in hard quantizer 606. The LSBs of the N-bit sample of 603 pass unchanged. Error signal 609 is filtered through filter 610 creating N-bit feedback signal 611. It should be appreciated, however, that any M-bits of signal 603 may be retained in hard quantizer 606 depending on the particular application. Finally, a 12-bit digital-to-analog converter (DAC) 612 is used to convert the hard quantizer output signal 613 to an analog signal 155A–155N which is broadcast via antennas 160A–160N.

It will be appreciated that one of the primary functions of the quantization noise reduction device is to quantize the N-bit signal to an M-bit signal, where M≦N, for processing by the digital to analog converter DAC 612. As such, a number of alternatives to the disclosed digital quantization noise reduction device 150 exist.

Figure 7:
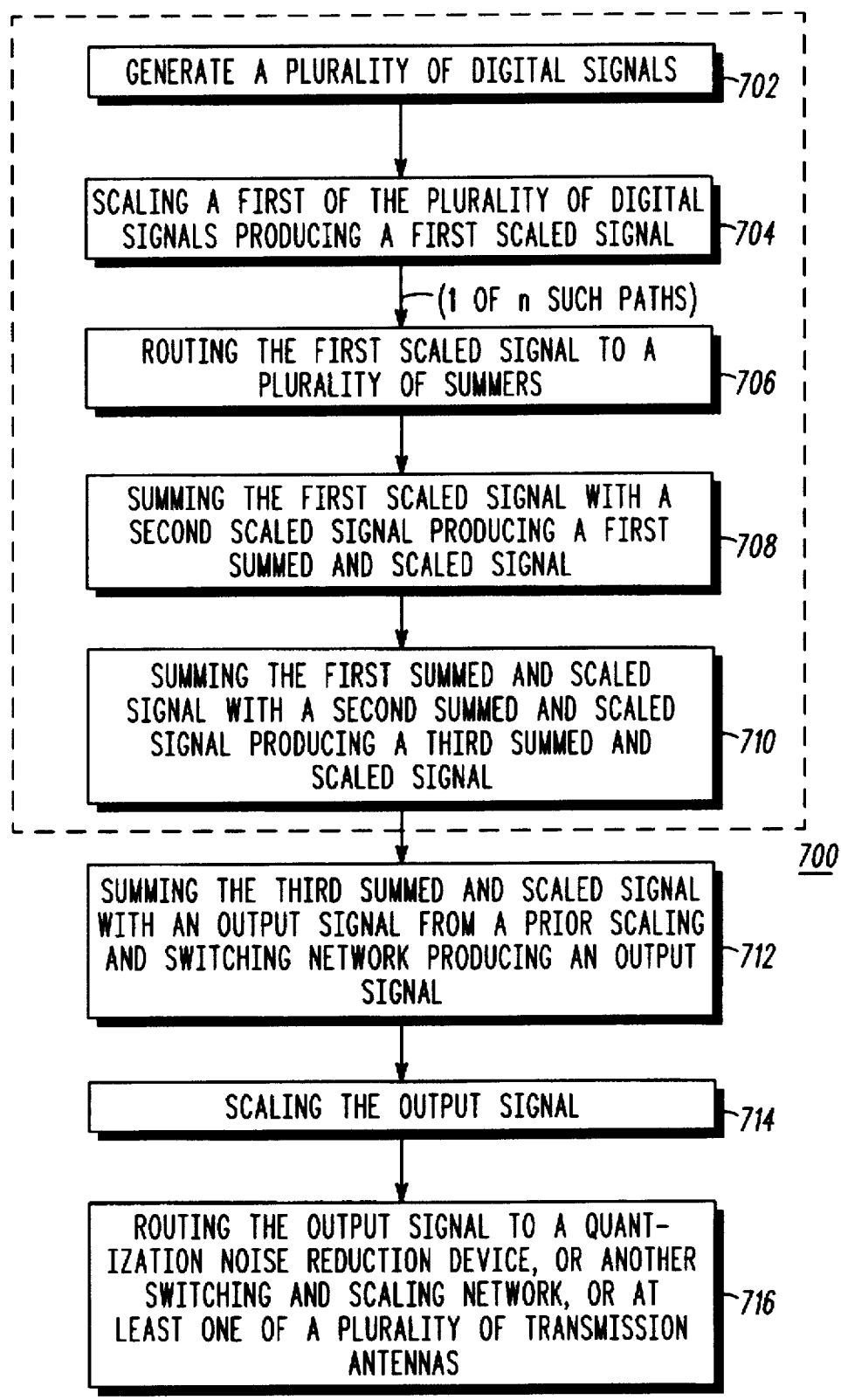
FIG. 7 is a flow chart illustrating operation of the apparatus of FIG. 1.

Referring to FIG. 7, a preferred embodiment of a method for directing a digital signal to a plurality of paths is illustrated. Specifically, FIG. 7 represents a method for routing a digital signal to a plurality of paths, the method comprising in step 702 generating a plurality of digital signals. Scaling a first digital signal from the plurality of digital signals in step 704 producing a first scaled signal, before selectively routing the first scaled signal to one or a plurality of summers in step 706. In step 708, summing the first scaled signal with a second scaled signal from the plurality of digital signals producing a first summed scaled signal. Similarly, in step 710, summing a third scaled signal with a fourth scaled signal producing a second summed scaled signal, which is summed with the first summed scaled signal to produce a third summed scaled signal. The third summed scaled signal is summed with an output signal from a prior scaling and switching process, producing an output signal in step 712. The output signal is then scaled in step 714 and, preferably, routed in step 716 to a quantization noise reduction device, but may be routed to yet another scaling and switching network (712), or to a plurality of transmission antennas.

The many advantages and features of the present invention will be appreciated from the foregoing description of the preferred embodiments. It should be understood that many other embodiments, advantages and features fall within its fair scope as may be understood from the subjoined claims.

What we claim is:

1. An apparatus for routing a signal to a plurality of paths, the apparatus comprising:

a modulator including a numerically controlled oscillation and modulation device;

a first switch responsive to the modulator;

a second switch;

a first adder responsive to the first and second switches;

a third switch;

a fourth switch;

a second adder responsive to the third and fourth switches; and a third adder responsive to the first and second adders.

2. The apparatus of claim 1, wherein the second switch is responsive to the modulator.

3. The apparatus of claim 1, wherein the first adder includes a first input coupled to an output of the first switch and a second input responsive to an output of the second switch.

4. The apparatus of claim 1, wherein the second adder includes a first input coupled to an output of the third switch and a second input responsive to an output of the fourth switch.

5. The modulator of claim 1, wherein the numerically controlled oscillation and modulation device comprises a phase accumulator and a sinusoid generator responsive to the phase accumulator.

6. The modulator of claim 5, wherein the numerically controlled oscillation and modulation device further comprises an adder and wherein the phase accumulator is responsive to the adder.

7. The apparatus of claim 1, further comprising:

a fifth switch a sixth switch;

a fourth adder responsive to the fifth and sixth switches;

a seventh switch;

an eighth switch;

a fifth adder responsive to the seventh and eighth switches;

a sixth adder responsive to the fourth and fifth adders;

a first combiner responsive to the third adder and a signal source; and a first signal multiplier responsive to the third adder.

8. The apparatus of claim 7, wherein the first signal multiplier includes an input coupled to an output of the first combiner.

9. The apparatus of claim 7, further comprising a second combiner responsive to the sixth adder and a signal source.

10. The apparatus of claim 9, further comprising a second signal multiplier responsive to the second combiner.

11. The apparatus of claim 10, further comprising a tenth switch responsive to the second signal multiplier and the second combiner.

12. The apparatus of claim 7, further comprising a ninth switch responsive to the first signal multiplier and the first combiner.

13. An apparatus for routing a signal to a plurality of paths, the apparatus comprising:

a quadrature frequency upconversion/modulation device (QFUM);

a first switch responsive to the QFUM;

a second switch;

a first adder responsive to the first and second switches;

a third switch;

a fourth switch;

a second adder responsive to the third and fourth switches; and a third adder responsive to the first and second adders.

14. The apparatus of claim 13, wherein the QFUM comprises a numerically controlled oscillator and a digital mixer.

15. The apparatus of claim 14, wherein the QFUM further comprises an interpolation filter.

16. The apparatus of claim 15, wherein the interpolation filter is a Finite Impulse Response (FIR) filter.

17. An apparatus for routing a digitized RF signal to a plurality of paths, the apparatus comprising:

a multi-function upconverter/modulator;

a first switch responsive to the multi-function upconverter/modulator;

a second switch;

a first adder responsive to the first switch and the second switch;

a third switch;

a fourth switch;

a second adder responsive to the third switch and the fourth switch; and a third adder responsive to the first adder and the second adder.

18. The apparatus of claim 17, further comprising:

a first signal selector responsive to an input signal a first interpolation filter responsive to the first signal selector;

a first scaler responsive to the first interpolation filter;

a first mixer responsive to the first interpolation filter and a numerically controlled oscillator;

a first phase accumulator responsive to the first interpolation filter; and a first mode-selection multiplexor (MUX) responsive to the first phase accumulator and a second phase accumulator.

19. The apparatus of claim 18, wherein the first interpolation filter is a Finite Impulse Response (FIR) filter.

20. A method of routing a digital RF signal to a plurality of paths, the method comprising the steps of:

generating a plurality of digital signals;

scaling a first digital signal from the plurality of digital signals to produce a first scaled signal;

routing the first scaled signal to a plurality of summers;

adding the first scaled signal to a second scaled signal producing a first summed and scaled signal;

adding the first summed and scaled signal to a second summed and scaled signal producing a third summed and scaled signal;

adding the third summed and scaled signal to an output signal from a prior scaling and switching network producing an output signal;

scaling the output signal; and routing the output signal to at least one of a plurality of transmission antennas.

* * * * *

UNITED STATES PATENT AND TRADEMARK OFFICE
CERTIFICATE OF CORRECTION

PATENT NO. : 5,754,597
DATED : May 19, 1998
INVENTOR(S) : Lurey, et al.

It is certified that error appears in the above-indentified patent and that said Letters Patent is hereby corrected as shown below:

Column 8, line 66 reads "wherein the phase" should be --wherein a phase--.

Signed and Sealed this

Twelfth Day of October, 1999

Attest:

Q. TODD DICKINSON

*Attesting Officer*    *Acting Commissioner of Patents and Trademarks*